Figure 1:
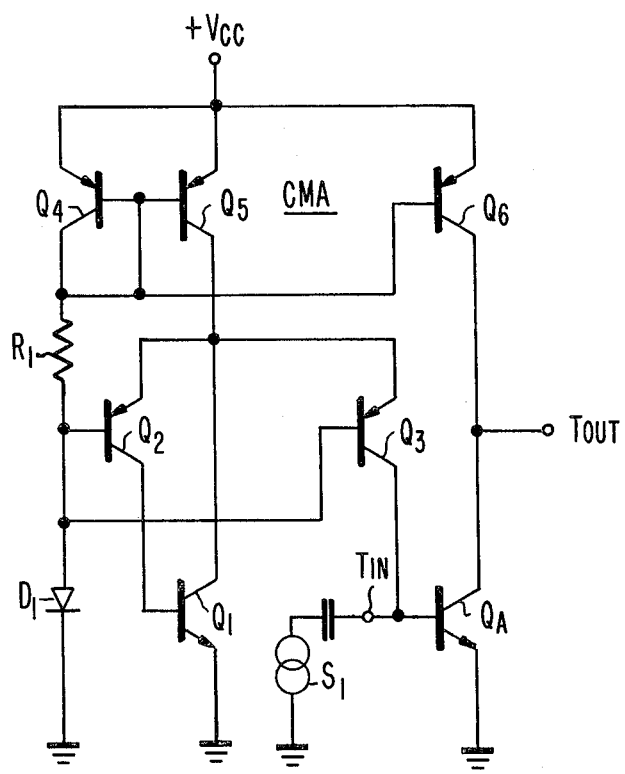

United States Patent

Radovsky

[11] 3,999,140
[45] Dec. 21, 1976

[54] BIAS CURRENT CIRCUIT
[75] Inventor: Jonathan Samuel Radovsky, Trenton, N.J.
[73] Assignee: RCA Corporation, New York, N.Y.
[22] Filed: Mar. 8, 1976
[21] Appl. No.: 664,767
[52] U.S. Cl. .................................. 330/22; 323/4; 330/17; 330/18; 330/25; 330/40
[51] Int. Cl.² ........................................ H03F 3/04
[58] Field of Search ............... 323/2, 4; 330/17, 18, 330/19, 22, 25, 40

[56] References Cited
UNITED STATES PATENTS

| | | | |
|---|---|---|---|
| 3,668,541 | 6/1972 | Pease | 330/23 |
| 3,916,331 | 10/1975 | Schenck | 330/19 X |
| 3,938,053 | 2/1976 | Menneti | 330/17 |

Primary Examiner—R. V. Rolinec
Assistant Examiner—Lawrence J. Dahl
Attorney, Agent, or Firm—H. Christoffersen; S. Cohen; A. L. R. Limberg

[57] ABSTRACT

Circuit for producing a bias current which is inversely proportional to the common emitter forward gain ($h_{fe}$) of a transistor. It includes a first transistor and second and third transistors of opposite conductivity type to the first. The base emitter paths of the second and third transistors are connected in parallel. The first transistor has collector-to-base feedback to regulate its collector current to a prescribed value, which feedback connection is through the emitter-to-collector path of the second transistor. The bias current proportional to the prescribed value divided by the $h_{fe}$ of the first transistor is provided at the collector of the third transistor.

6 Claims, 2 Drawing Figures

BIAS CURRENT CIRCUIT

The present invention relates to bias circuits for supplying bias currents inversely proportional to the common-emitter current gain, or $h_{fe}$, of a transistor.

Examples of this type of bias circuit are known from U.S. Pat. Nos. 3,846,696, 3,855,541, 3,878,471, 3,887,880 and 3,891,935. Bias circuits embodying the present invention are simpler than those shown in the patents above in circumstances when it is desired to divide a prescribed input bias current by the $h_{fe}$ of a transistor to provide a similarly directed output bias current. The bias circuit described herein is particularly suitable for supplying quiescent base bias current to an associated common-emitter amplifier transistor.

Figure 2:
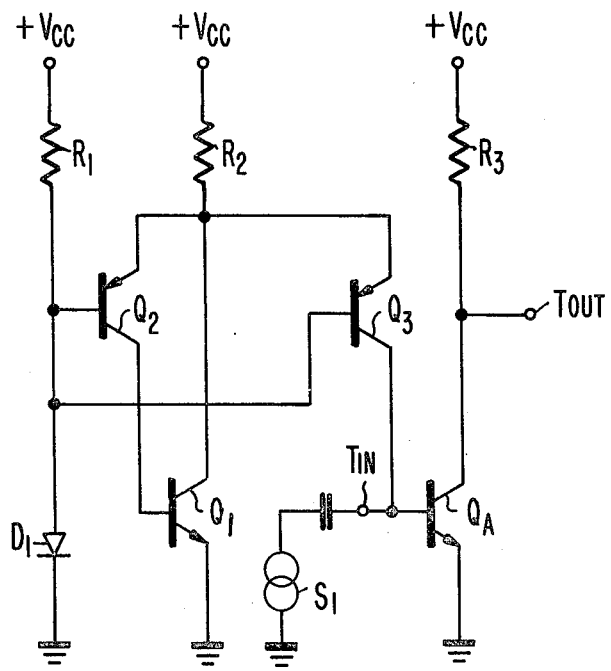

In the drawing:

FIG. 1 is a schematic diagram of a bias circuit embodying the present invention, shown biasing the base electrode of a common-emitter amplifier transistor; and FIG. 2 is a schematic diagram of a representative alternative configuration to that shown in FIG. 1.

In FIG. 1, common-emitter amplifier transistor $Q_A$ is provided quiescent base current which varies in inverse proportion to its $h_{fe}$. This, by means of a bias circuit essentially comprising transistors $Q_1$, $Q_2$ and $Q_3$. $Q_1$ has an $h_{fe}$ similar to that of $Q_A$, which similarity is maintained despite temperature change, by virtue of $Q_A$ and $Q_1$ being arranged to share the same thermal environment— e.g., that of a monolithic integrated circuit chip. $Q_2$ and $Q_3$, which have parallelled base-emitter paths and are of complementary conductivity type to that of $Q_1$, are arranged to have proportional effective transconductance ($g_m$) characteristics and to this end may be arranged in the same thermal environment as each other and/or provided with current feedback resistors (not shown) in series with their base-emitter paths.

$Q_4$, $Q_5$ and $Q_6$, also of complementary conductivity type to $Q_1$, are connected as a dual output current mirror amplifier, CMA. The input terminal of the CMA is connected via the serial connection of resistor $R_1$ and diode $D_1$ to ground, and the common-terminal of the CMA is connected to the operating potential $+V_{CC}$. The resultant current flow through the input circuit of the CMA, $R_1$, and $D_1$ is equal to $(V_{CC} - 2V_{BE})/R_1$, where $V_{BE}$ is the offset potential across a semiconductor junction such as the base-emitter junction of self-biased transistor $Q_4$ or $D_1$, and $R_1$ is the resistance of resistor $R_1$. The first and second output terminals of the CMA at the collector electrodes of $Q_5$ and $Q_6$, respectively, respond with respective currents related as the transconductances $g_{m5}$ and $g_{m6}$ of $Q_5$ and $Q_6$, respectively, to the transconductance $g_{m4}$ of $Q_4$. That is, $Q_5$ and $Q_6$ are each conditioned to operate as a constant current source.

$Q_2$ provides, by means of its common-base-amplifier action, degenerative collector-to-base feedback to $Q_1$ for regulating $Q_1$'s collector current $I_{C1}$ demand substantially to equal the constant current supplied from the collector electrode of $Q_5$. ($Q_2$ like any transistor, exhibits internal current feedback in carrying out common-base amplifier action, adjusting its base current to support the emitter current flow forced on it here by the collector-to-base feedback of $Q_1$.) Assuming the $h_{fe}$ of $Q_1$ to be at least 10 or so, as is normally the case, only a relatively small portion of the constant current provided by $Q_5$ flows as emitter currents in $Q_2$ and $Q_3$. The emitter current of $Q_2$ is required to supply base current to $Q_1$ via the common-base amplifier action of $Q_1$, and a related current flows in $Q_3$ because of their parallelled base-emitter paths. So, the collector current $I_{C2}$ of $Q_2$ is substantially equal to the collector current $I_{C5}$ of $Q_5$ divided by the common-emitter current gain $h_{fe1}$ of $Q_1$. ($I_{C2} \approx I_{C5}/h_{fe1}$). Owing to the parallelled base-emitter paths of $Q_2$ and $Q_3$, the collector current of $I_{C3}$ of $Q_3$ is equal to $I_{C2}$ times the effective transconductance $g_{m3}$ of $Q_3$ divided by the effective transconductance $g_{m2}$ of $Q_2$. ($I_{C3} = I_{C2} (g_{m3}/g_{m2})$. Therefore, $I_{C3} \approx (I_{C5}/h_{fe1}) (g_{m3}/g_{m2})$, where $g_{m3}/g_{m2}$ remains essentially constant during operation. The desired objective of the present invention, providing a bias circuit for providing a current which is substantially in inverse proportion to the $h_{fe}$ of a transistor, is therefore achieved.

Applying $I_{C3}$ as quiescent base current to $Q_A$, which has the same $h_{fe}$ as $Q_1$ will cause $Q_A$ to demand a quiescent collector current $I_{CA}$ that is $h_{fe}$ times as large as its base current, equal to $I_{C3}$. $I_{CA}$ is therefore substantially independent of $h_{fe}$ and can be expressed as follows. $I_{CA} \approx I_{C5} (g_{m3}/g_{m2})$. If $g_{m6}/g_{m5}$ is made equal to $(g_{m3}/g_{m2})$ the quiescent collector current $I_{CA}$ demanded by $Q_A$ will be met with a substantial degree of exactness by the collector current $I_{C6}$ provided by $Q_6$. So, no substantial amount of quiescent current need flow through the output terminal $T_{OUT}$ or any load connected thereto. The quiescent potential at $T_{OUT}$ will be determined by the load connections and might, for example, be $+V_{CC}/2$ where the load is a resistive one connected between $T_{OUT}$ and a $+V_{CC}/2$ potential.

The point to be made here is that the application of a quiescent base current to a transistor, which current is inversely proportional to the $h_{fe}$ of the transistor results in a well-defined collector current independent of the variations with temperature otherwise attributable to its $h_{fe}$, that would obtain from current-mode base biasing. Current-mode biasing of the base of $Q_A$—that is, biasing from a bias circuit with relatively high source impedance compared to the impedance at its base electrode—is desirable. It avoids lowering of the input impedance the input signal source $S_1$ "sees" at the terminal $T_{IN}$ to which the base electrode of $Q_A$ connects.

FIG. 2 shows an alternative way for controlling the value to which $I_{C1}$ is regulated. $R_1$ biases $D_1$ into forward conduction to develop a $1V_{BE}$ potential offset thereacross, and the emitter follower actions of $Q_2$ and $Q_3$ tend to hold their emitter potentials at $+2V_{BE}$. This causes a tendency for current flow of $(V_{CC} - 2V_{BE})/R_2$ through resistor $R_2$, which has a resistance $R_2$, which current flows primarily as $I_{C1}$, being conducted to ground through the collector-emitter path of $Q_1$. Any tendency for $I_{C1}$ to be too large reduces the base-emitter potential of $Q_2$, curtailing the collector current $Q_2$ provided to the base electrode of $Q_1$, thereby reducing the conduction of $Q_1$ and reducing $I_{C1}$. Any tendency for $I_{C1}$ to be too small increases the base-emitter potential of $Q_2$, increasing $I_{C2}$, increasing the conduction of $Q_1$, and increasing $I_{C1}$.

The operation of the FIG. 2 bias circuit is concisely stated as follows. $I_{C1} \approx (V_{CC} - 2V_{BE})R_2$. $I_{C2} \approx (V_{CC} - 2V_{BE})/R_2 h_{fe1}$. $I_{C3} \approx (g_{m3}/g_{m2})(V_{CC} - 2V_{BE})/R_2 h_{fe1}$. As in FIG. 1, $g_{m3}$ remains in substantially fixed proportion to $g_{m2}$ during operation, that is, $g_{m3}/g_{m2}$ remains essentially constant. The bias circuit of the FIGURE thus achieves the objective of providing a bias current inversely proportional to transistor $h_{fe}$. Applied as quiescent base current to $Q_A$, the following collector current $I_{CA}$ is demanded. $I_{CA} = (g_{m3}/g_{m2})(V_{CC} - 2V_{BE})/R_2$. The quiescent potential at $T_{OUT}$ can be made $(V_{CC}/2)+V_{BE}$, suitable for application to an emitter follower stage, for example, by making the resistance $R_3$ of resistor $R_3$ obey the following relationship. $R_3 = (R_2/2)(g_{m2}/g_{m3})$.

The biasing of the base electrodes of $Q_2$ and $Q_3$ at $+1V_{BE}$ is interesting in that it places equal potentials on the base and collector electrodes of these transistors and avoids leakage across their respective collector-base junctions, to eliminate an effect having a second order influence on the proportioning of their collector currents. The base electrodes of $Q_2$ and $Q_3$ can be biased to other more positive potentials, however. This can be done for instance by replacing the series connection of $R_1$ and $D_1$ with a resistive potential divider.

A number of variations in the described circuits are possible within the scope of the present invention. Transistors $Q_1$ and $Q_A$ may be composite transistors comprising respective Darlington cascades of like numbers of transistors. So may $Q_2$ and $Q_3$. An emitter follower may replace the direct connection of the collector electrode of $Q_1$ to the joined emitter electrodes of $Q_2$ and $Q_3$ to improve the inverse proportionality of $I_{C3}$ to $h_{fe1}$. The provision of current to the collector electrode of $Q_1$ for $I_{C1}$ to be regulated against can be carried out in a variety of ways known in the art.

What is claimed is:

1. In combination:
   a first, bipolar transistor of a first conductivity type, said first transistor having base and collector electrodes between which a current gain of amplitude $h_{fe}$ is exhibited and having an emitter electrode;
   means connecting the emitter electrode of said first transistor to a point of fixed potential for referring the emitter potential of said first transistor to said fixed potential;
   second and third transistors of a second conductivity type complementary to said first conductivity type, each of said second and third transistors having a principal output current conducting path between first and second electrodes thereof and having a control electrode controllable in reference to its said first electrode, said second and third transistors exhibiting effective transconductances proportional to each other;
   means for maintaining substantially-equal potentials at the control electrodes of said second and third transistors;
   means for maintaining substantially equal potentials at the first electrodes of said second and third transistors;
   means for supplying a prescribed current to the collector electrode of said first transistor;
   means applying collector-to-base feedback to said first transistor for adjusting its emitter-to-base potential to condition said first transistor to conduct at least a portion of said prescribed current, including a direct coupling from the collector electrode of said first transistor to the first electrode of said second transistor, and including a direct coupling from the second electrode of said second transistor to the base electrode of said first transistor; and
   means for utilizing the current flowing through the second electrode of said third transistor, said current being substantially inversely proportional to $h_{fe}$.

2. The combination set forth in claim 1 wherein said means for utilizing the collector current of said third transistor includes a fourth, bipolar transistor having a base electrode to which the second electrode of said third transistor is connected and having emitter and collector electrodes biased for normal transistor operation, said fourth transistor exhibiting a current gain of amplitude $h_{fe}$ between its base and collector electrodes, whereby the collector quiescent current of said fourth transistor is proportionally related to said prescribed current.

3. The combination set forth in claim 1 wherein said means for supplying a prescribed current comprises:
   means for maintaining a fixed potential between the control electrode of said second transistor and a point of connection; and
   a resistor connecting the collector electrode of said first transistor to said point of connection.

4. The combination set forth in claim 1 wherein said means for utilizing the current flowing through the second electrode of said third transistor includes:
   a fourth, bipolar transistor of the same conductivity type as said first, bipolar transistor, said fourth transistor having base and collector electrodes between which a current gain of amplitude $h_{fe}$ is exhibited and having an emitter electrode;
   a direct current conductive path from the second electrode of said third transistor to the base electrode of said fourth transistor; and
   means for connecting said fourth transistor as a common-emitter amplifier for signal, including
   signal-conductive means connecting the emitter electrode of said fourth transistor to a point of fixed potential for referring the emitter potential of said fourth transistor to said fixed potential.

5. In combination:
   first and second transistors of a first conductivity type, each having base and collector electrodes between which a current gain of $h_{fe}$ is exhibited and having an emitter electrode;
   means for connecting said first transistor as a common-emitter amplifier for signal, which means includes
   signal-conductive means connecting the emitter electrode of said first transistor to a point of fixed potential for referring the emitter potential of said first transistor to said fixed potential;
   third and fourth transistors of a second conductivity type complementary to said first conductivity type, each of said third and fourth transistors having a principal output current conducting path between first and second electrodes thereof and having a control electrode controllable in reference to its said first electrode, said third and fourth transistors exhibiting effective transconductances proportional to each other;
   means for maintaining substantially equal potentials at the control electrodes of said third and fourth transistors;
   means for maintaining substantially equal potentials at the first electrodes of said third and fourth transistors;
   means for supplying a prescribed current, connected between the emitter and collector electrodes of said second transistor;
   means applying collector-to-base feedback to said second transistor for adjusting its emitter-to-base potential to condition said second transistor to conduct at least a portion of said prescribed current, including a direct coupling from the collector electrode of said second transistor to the first electrode of said third transistor, and including a direct coupling from the second electrode of said third transistor to the base electrode of said second transistor; and means connecting the second electrode of said fourth transistor to the base electrode of said first transistor for causing the quiescent current flows through these two electrodes to be substantially equal.

6. A combination as set forth in claim 5 having:

means connecting the emitter electrode of said second transistor to said point of fixed potential for referring said second transistor to said fixed potential.

* * * * *